US006653762B2

(12) United States Patent
Takeshima

(10) Patent No.: US 6,653,762 B2
(45) Date of Patent: Nov. 25, 2003

(54) PIEZOELECTRIC TYPE ELECTRIC ACOUSTIC CONVERTER

(75) Inventor: Tetsuo Takeshima, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 39 days.

(21) Appl. No.: 09/834,679

(22) Filed: Apr. 13, 2001

(65) Prior Publication Data

US 2001/0045792 A1 Nov. 29, 2001

(30) Foreign Application Priority Data

Apr. 19, 2000 (JP) ....................................... 2000-117340

(51) Int. Cl.[7] ................................................ H01L 41/08

(52) U.S. Cl. ......................... 310/340; 310/330; 310/332

(58) Field of Search ................................ 310/340, 312, 310/332, 330, 322, 334, 324

(56) References Cited

U.S. PATENT DOCUMENTS 2,769,930 A * 11/1956 Sturm ........................ 29/25.35
2,814,575 A * 11/1957 Lange, Jr. ................... 310/340
3,230,402 A * 1/1966 Nightingale et al. ........ 310/340
3,846,650 A * 11/1974 Barrow ....................... 310/312
4,237,399 A * 12/1980 Sakamoto ............... 310/332 X
4,593,160 A * 6/1986 Nakamura .............. 310/334 X
4,649,525 A * 3/1987 Angona et al. ............... 367/31
4,742,264 A * 5/1988 Ogawa ....................... 310/332
4,939,405 A * 7/1990 Okuyama et al. ........... 310/330
5,233,256 A * 8/1993 Hayashi et al. ......... 310/332 X
5,856,956 A * 1/1999 Toki ........................... 310/324
6,016,024 A * 1/2000 Unami et al. ............... 310/345
6,118,207 A * 9/2000 Ormerod et al. ............ 310/328
6,307,300 B1 * 10/2001 Yamamoto et al. ......... 310/322
2001/0004180 A1 * 6/2001 Kishimoto .................. 310/324
2001/0009344 A1 * 7/2001 Furuhawa et al. .......... 310/358
2001/0045792 A1 * 11/2001 Takeshima .................. 310/340

FOREIGN PATENT DOCUMENTS

DE 10007455 A1 * 8/2000 ............ G10H/3/00
EP 1032244 A2 * 8/2000 ........... H04R/17/00
JP 61-205100 9/1986
JP 11355890 A * 12/1999 ........... H04R/17/00
JP 11355891 A * 12/1999 ........... H04R/17/00
JP 11355892 A * 12/1999 ........... H04R/17/00
JP 2000004499 A * 1/2000 ........... H04R/17/00
JP 2000310990 A * 11/2000 .......... G10K/9/122
JP 2000312398 A * 11/2000 ........... H04R/17/00
JP 2001036990 A * 2/2001 ........... H04R/17/00
JP 2001095094 A * 4/2001 ........... H04R/17/00
JP 2001168405 A * 6/2001 ......... H01L/41/083

* cited by examiner

*Primary Examiner*—Mark Budd
(74) *Attorney, Agent, or Firm*—Keating & Bennett, LLP

(57) ABSTRACT

A piezoelectric type electric acoustic converter achieves large improvement in shatter resistance strength, increased operating efficiency and reduced size, and includes piezoelectric ceramic layers which are laminated to form a laminate. Main surface electrodes are disposed on the front and back main surfaces of the laminate, and an internal electrode is disposed between respective ceramic layers. A side electrode which connects the main surface electrodes, and a side electrode which is conducted to the internal electrode are formed on the side surface of the laminate. All the ceramic layers are polarized in the same direction, and by applying an alternating signal between the main surface electrodes and the internal electrode, bending vibration of the laminate occurs. The front and back surfaces of the laminate is almost entirely covered with resin-layers.

7 Claims, 6 Drawing Sheets

PIEZOELECTRIC TYPE ELECTRIC ACOUSTIC CONVERTER

BACKGROUND OF THE INVENTION

1. Field of the Invention

The present invention relates to a structure of piezoelectric type electric acoustic converters, such as a piezoelectric earphone, a piezoelectric sounding device, a piezoelectric speaker, and a piezoelectric buzzer, especially a diaphragm thereof.

2. Description of the Related Art

Conventionally, a piezoelectric type electric acoustic converter is widely used for a piezoelectric earphone, a piezoelectric buzzer, or other suitable piezoelectric device. A common structure of this piezoelectric type electric acoustic converter is that a metal plate of circular form is bonded on one side of a circular piezoelectric ceramic board to provide a unimorph type diaphragm, and a circumference of this diaphragm is supported in a circular case, and an opening of the case is closed with a cover. However, in the unimorph type diaphragm, there is a defect in that the displacement magnitude produced by the sound pressure is small, since the bending vibration is obtained by attaching the ceramic board, the outer diameter of which expands in response to the application of the voltage, to the metal plate which does not change dimensions.

In addition, a bimorph type diaphragm of the laminate structure including a plurality of piezoelectric ceramics layers is proposed in the unexamined Japanese patent publication No. 61-205100 gazette. This diaphragm is constructed by laminating a plurality of ceramic green sheets and a plurality of electrodes, and using the sintered compact body which is obtained by baking the sheets and electrodes at the same time. The electrodes are electrically connected via the through-holes formed at a position which does not constrain the vibration of a diaphragm. Compared with the unimorph type, the amount of larger displacement, i.e., larger sound pressure, can be obtained by arranging first and a second vibrating regions in the thickness direction in order so that they may vibrate in a reversed direction mutually.

However, in a case of the above-described bimorph type diaphragm, for example, if the bending vibration of the diaphragm including three ceramic layers is carried out, as shown in Figure 17 of the above publication, the electrode of one main surface and one internal electrode should be mutually connected via a through hole. Another main surface electrode and another internal electrode need to be mutually connected via a through hole, and an alternating voltage needs to be applied therebetween. Therefore, the complicated interconnection between the main surface electrode and the internal electrode is necessary, and the cost thereof may become expensive.

Consequently, the applicant of the present invention eliminates the interconnection of the main-surface electrode and the internal electrode, and provides a piezoelectric type electric acoustic converter which defines a bimorph type diaphragm from a simple connection structure (in Japanese Patent Application No. 11-207198 which has not been published yet). This electric acoustic converter is characterized in that two or three piezoelectric ceramic layers are laminated to form a laminate body, main surface electrodes are formed on front and back main surfaces of this laminate body, internal electrodes are formed between respective ceramic layers, and all the ceramic layers are polarized in the thickness direction in the same direction. The bending vibration of the laminate can be performed by applying an alternating signal between the main-surface electrode and the internal electrode.

In the case of such a bimorph type diaphragm, there is a feature that larger sound pressure can be obtained compared with a unimorph type diaphragm. On the other hand, the shock resistance is low since there was no reinforcement by the metal plate, and when it is used for a portable terminal or other such uses, sufficient shatter resistance strength was not obtained.

SUMMARY OF THE INVENTION

In order to overcome the problems described above, preferred embodiments of the present invention provide a bimorph type diaphragm which obtains a large sound pressure while having a simple connection structure, and to provide a piezoelectric type electric acoustic converter which achieves a much greater improvement in shatter strength.

According to a first preferred embodiment of the present invention, a piezoelectric sound converter includes piezoelectric ceramic layers which are laminated to form a laminate, and main surface electrodes disposed on front and back main surfaces of the laminate, an internal electrode disposed between respective ceramic layers, the ceramic layers being polarized in the same direction, and the bending vibration of the laminate is performed by applying an alternating signal between the main surface electrode and the internal electrode. The front and back surfaces of the laminate are substantially completely covered with a resin layer.

If an alternating voltage is applied between the main surface electrode and the internal electrode in the laminate of this preferred embodiment of the present invention, the direction of an electric field acting in the ceramic layer of the front side and the back side will turn into a reverse direction in the thickness direction. On the one hand, the polarization direction of all ceramic layers have the same direction in the thickness direction. A piezoelectric ceramic used for the layers has the characteristic of shrinking in a direction of a flat surface if the direction of a polarization and the direction of an electric field are the same direction, and if the direction of a polarization and the direction of an electric field are reverse directions, it has the characteristic of extending in a direction of a flat surface. Therefore, when the alternating voltage is applied as mentioned above and the ceramic layer of the front side is expanded (shrunk), the ceramic layer of a back side will be shrunk (expanded) and a laminate will generate the bending vibration as a whole. Because this amount of displacement is larger compared with a unimorph type diaphragm, sound pressure is greatly increased.

The conventional laminate including ceramics is weak against an external shock applied thereto, while a sound pressure thereof is large. In preferred embodiments of the present invention, the laminate is reinforced by covering almost all of the front and back surfaces of a laminate with the resin layer, thereby greatly increasing the shatter resistance strength. Because this resin layer does not inhibit the bending vibration of the laminate, a sound pressure is not affected and a resonance frequency is not increased.

According to a second preferred embodiment of the present invention, the resin layer may be a stiffened coating layer provided after coating a paste-like resin in a film state. Alternatively, the resin layer may be a resin film attached to the laminate according to a third preferred embodiment of the present invention.

The resin material for forming a resin layer does not have the reinforcement effect of a laminate when it is a resin material with a low Young's modulus, such as a silicone group and a urethane group. Also, the resistance to external shock cannot be expected sufficiently. With a resin material with high Young's modulus, such as an epoxy group and an acrylic type, the shock resistance is greatly increased. As such materials, for example, polyimide resin, polyamide-imide resin, etc., are included.

According to a fourth preferred embodiment of the present invention, it is desirable to provide a laminate having a substantially rectangular shape. In a substantially rectangular laminate, processes, such as forming an electrode, laminating ceramic layers, a press attachment, baking, and a formation of a resin layer, can be performed in a stage of a mother board, so that material waste is minimized while mass production efficiency is greatly improved. Furthermore, when a substantially rectangular diaphragm is provided, sound conversion efficiency is greatly improved compared with a circular diaphragm, and there is an advantage that a low frequency sound can be generated.

It is sufficient to make the main surface electrodes of the front and back surfaces conduct mutually via the first side electrode formed on the side of the laminate as in a fifth preferred embodiment of the present invention, and to make the internal electrode conduct with the second side electrode formed on the side of a different position from the first side electrode. In this case, the electric connection with the exterior becomes simple by pulling out the main-surface electrode and the internal electrode via the side electrode.

It may be preferable to form the first and second side electrodes so that they may turn to the front and back surfaces of a resin layer according to a sixth preferred embodiment of the present invention. For example, when connecting the electric acoustic converter of the present invention electrically with the exterior, using electroconductive glue, or other material, the connection thereof becomes simple and the formation of the electrodes becomes simple.

According to a seventh preferred embodiment of the present invention, the second side electrode may turn to the front and back surfaces of the laminate. The notch part where a part of main surface electrodes of the front and back surfaces exposes, and the notch part where a part of the second side electrode turning to the front and back surfaces of the laminate exposes, may be formed with a resin layer.

In this case, it is not necessary to form an electrode on the surface of a resin layer as in the sixth preferred embodiment of the present invention, only an electrode is required to be formed on the laminate, so not only the electric connection with the exterior becomes simple, but also operation of an electrode formation becomes simple.

Other features, elements, characteristics and advantages of the present invention will become apparent from the detailed description of preferred embodiments thereof with reference to the attached drawings.

DETAILED DESCRIPTION OF PREFERRED EMBODIMENTS

FIGS. 1–4 show a first preferred embodiment of a piezoelectric sound converter according to the present invention. This piezoelectric electric acoustic converter preferably includes a substantially rectangular diaphragm 1 in the form of a laminate body, a case 10 which contains this diaphragm 1, and a board 20. This piezoelectric type electric acoustic converter is preferably constructed as a surface mount type component but can be constructed as another type component such as a pin type component.

Figure 1:
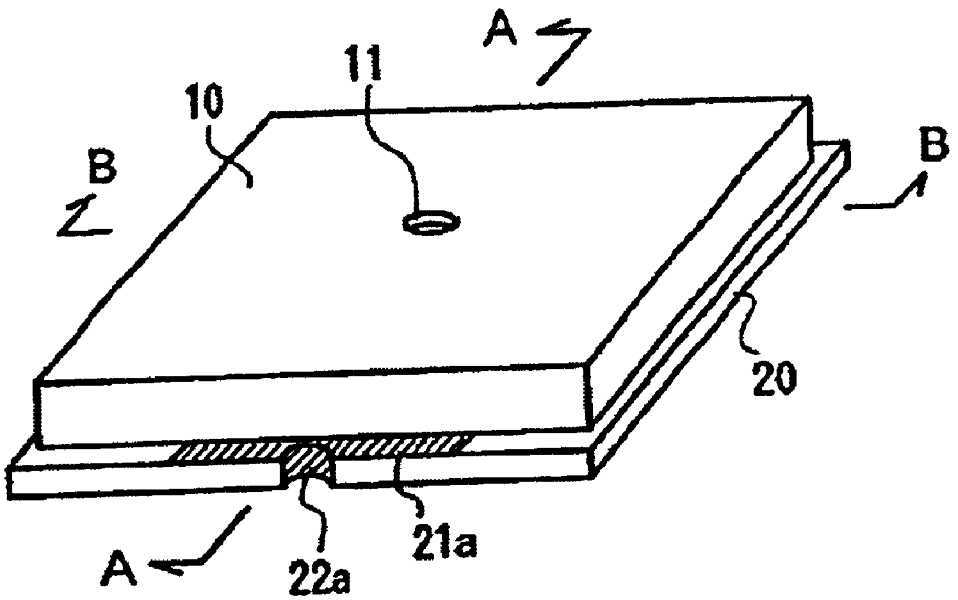
FIG. 1 is an exterior perspective diagram of a first preferred embodiment of a piezoelectric type electric acoustic converter according to the present invention.
Figure 2:
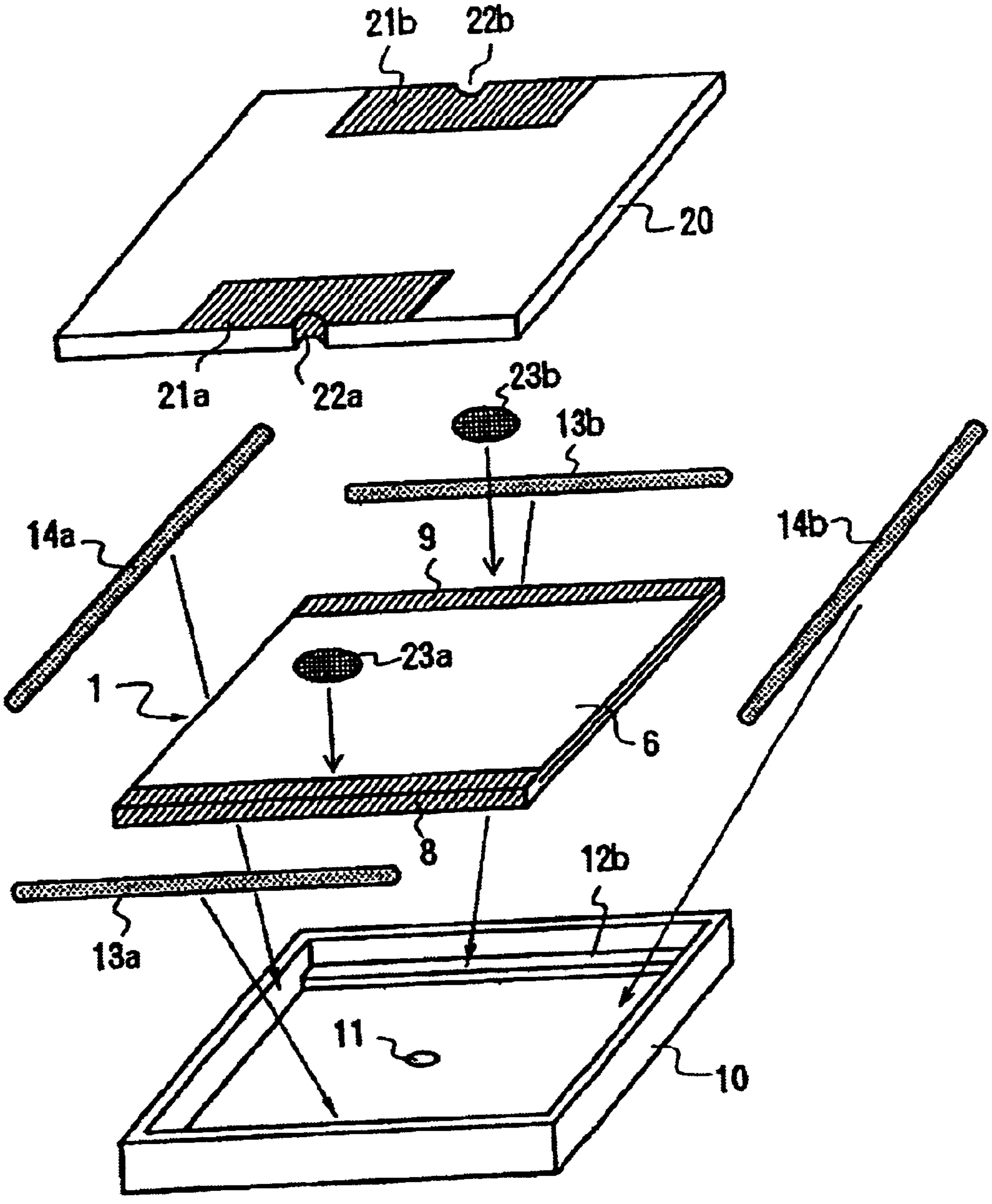
FIG. 2 is an exploded perspective view of the piezoelectric type electric acoustic converter shown in FIG. 1.
Figure 3:
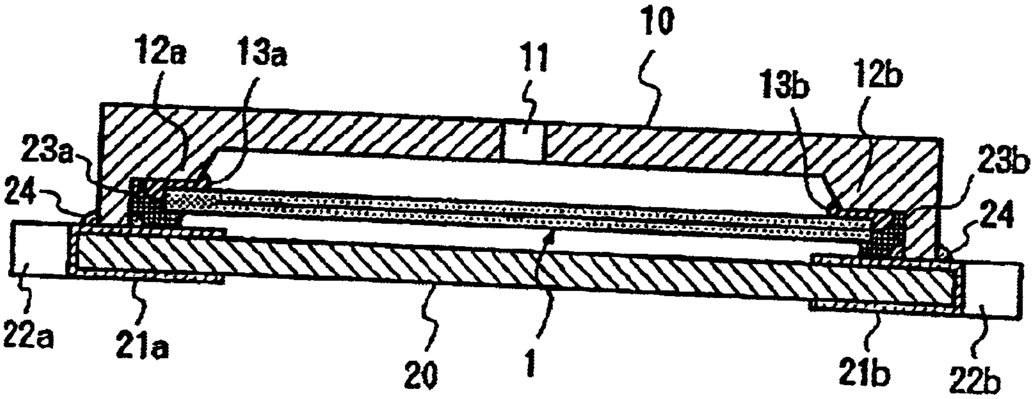
FIG. 3 is an A—A sectional view of FIG. 1.
Figure 4:
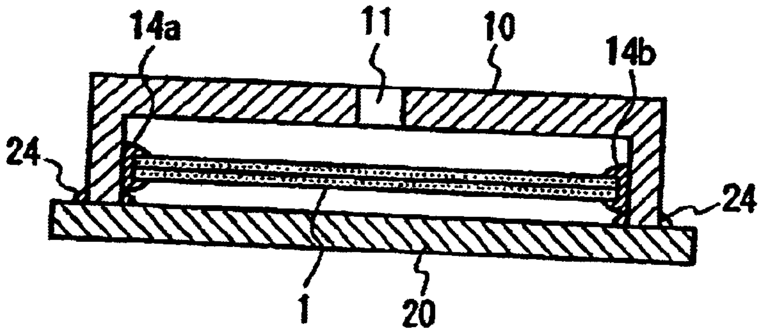
FIG. 4 is a sectional view taken along line B—B in FIG. 1.
Figure 5:
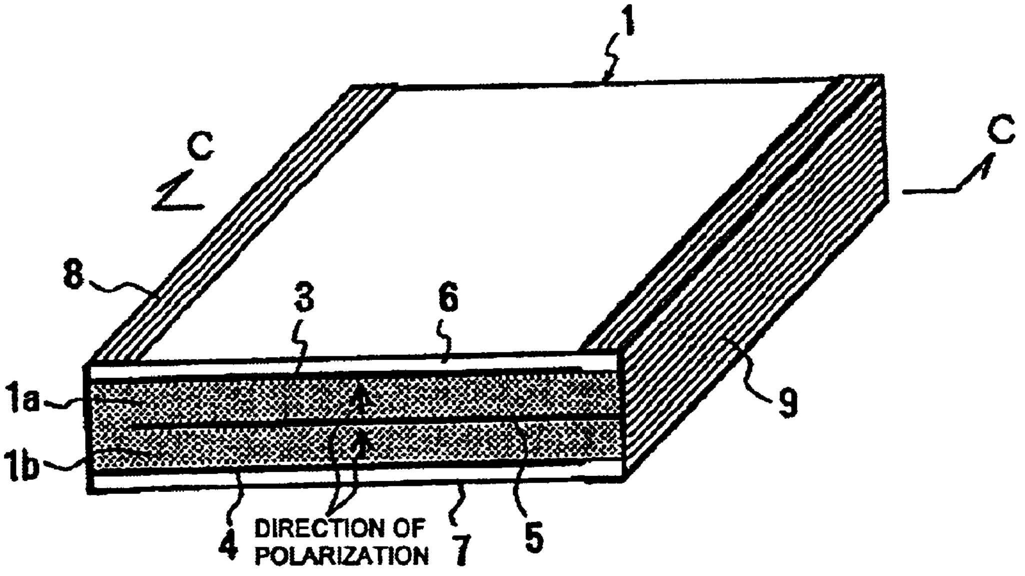
FIG. 5 is a perspective diagram of the diaphragm used for the piezoelectric type electric acoustic converter of FIG. 1.
Figure 6:
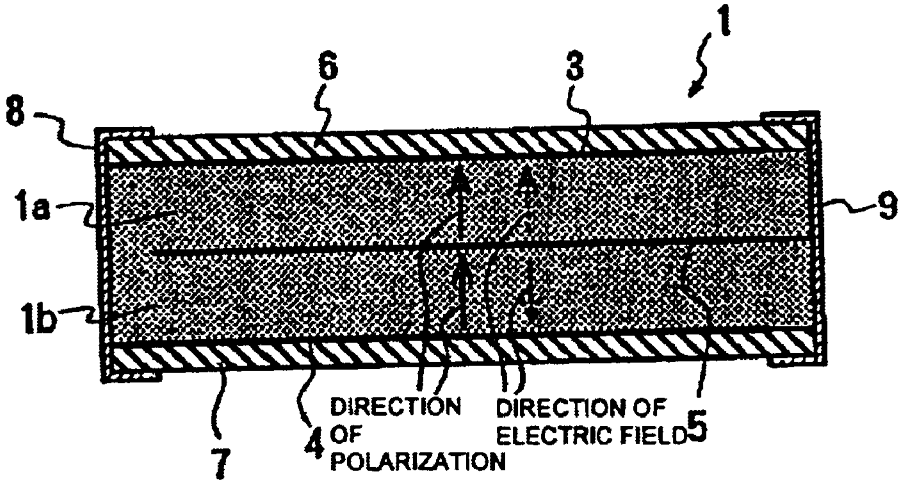
FIG. 6 is a sectional view taken along line C—C in FIG. 5.

The diaphragm 1 of this preferred embodiment is preferably formed by laminating two piezoelectric ceramics layers 1*a* and 1*b* preferably made of PZT or other suitable material, as shown in FIG. 5 and FIG. 6. The main surface electrodes 3 and 4 are provided on the front and back main surfaces of the diaphragm 1, and an internal electrode 5 is disposed between the ceramic layers 1*a* and 1*b*. As shown by a thick line arrow in those figures, the two ceramic layers 1*a* and 1*b* are polarized in the same direction in the thickness direction. In this preferred embodiment, the main surface electrode 3 of the front side and the main surface electrode 4 of the back side extends from one short side to just before another short side of the diaphragm 1. The internal electrode 5 extends from another short side to just before one short side as symmetrically as the main surface electrodes 3 and 4. The front and back surfaces of the diaphragm 1 are covered with resin-layers 6 and 7. After coating a paste-like resin in a film state, resin layers 6 and 7 may be coating layers that are stiffened or they may be layers to which the resin film is attached. As resin-layers 6,7, a material having a Young's modulus of about 1100 MPa is preferably used for hardening, such as an epoxy resin and acrylic-type resin.

The first side electrode 8 that is conducted to the main-surface electrodes 3 and 4 is disposed on one short-side side surface of the diaphragm 1, and the upper and lower sections of this side electrode 8 are arranged so that they may turn to the surfaces of the resin-layers 6 and 7. Moreover, the second side electrode 9 that is conducted to the internal electrode 5 is disposed on another short-side side of the diaphragm 1, and the upper and lower sections of this side electrode 9 are arranged so that they may turn to the surfaces of the resin-layers 6 and 7.

A case 10 preferably has a box configuration which has an upper-wall section and four side-wall sections, and is preferably made of heat resistant resin. A noise-emission hole 11 is formed on the upper-wall section, and a board 20 is bonded to an undersurface opening. Step-like support sections 12*a* and 12*b* are provided on an internal side surface of two side walls to which a case 10 is opposed, and two edges beside the short side of the diaphragm 1 are supported by support agents 13*a* and 13*b*, such as an adhesive agent, on these support sections 12*a* and 12*b*. Moreover, a gap between two edges of the longer side of the diaphragm 1 and the case 10 is sealed by elastic sealing agents 14*a* and 14*b*, such as silicone rubber. In addition, the same material of the elastic sealing agents 14*a* and 14*b* may be used as support agents 13*a* and 13*b*.

A board 20 includes a heat resistant resin, a glass epoxy, ceramic material, or other suitable material, similar to the case 10, and electrodes for external connection 21*a* and 21*b* are provided on the both ends of front and back surfaces. The electrodes 21*a* and 21*b* on front and back surfaces are mutually conducted via an inner surface of notch grooves 22*a* and 22*b* disposed on the both-end side edges of the board 20. The board 20 is attached to an undersurface opening of the case 10 via the insulating adhesive agent 24 in a state that the electric conductive glues 23*a* and 23*b* are coated in a shape of a continuous infusion on the side electrodes 8 and 9 of the diaphragm 1 fixed to the case 10. The side electrode 8 of the diaphragm 1 is connected with the electrode 21*a* for external connection by the electric conductive-glue 23*a*, and the side electrode 9 is connected with the electrode 21*b* for external connection by the electric conductive-glue 23*b*. In addition, the insulating adhesive agent 24 may be coated on the board 20, and it may be coated on the opening of the case 10. Then, a piezoelectric type electric acoustic converter is perfected by stiffening the electric conductive glues 23*a* and 23*b* and the insulating adhesive agent 24.

If a predetermined alternating voltage is applied between the electrodes for external connection 21*a* and 21*b*, the bending vibration of the diaphragm 1 will be performed in a length bending mode. That is, both ends of the short-side side of the diaphragm 1 define a fulcrum, and the bending vibration is performed, using the center section of a longitudinal direction as a peak-magnitude point. For example, if a negative voltage is applied to the side electrode 8 connected to the electrode 21*a* for external connection and a positive voltage is applied to the side electrode 9 connected to the electrode 21*b* for external connection, the electric field of the direction shown by the thin line arrow head of FIG. 6 will occur. The ceramic layers 1*a* and 1*b* have the characteristic of shrinking in the direction of a flat surface if the direction of the polarization and the direction of the electric field are the same directions, and if the direction of the polarization and the direction of the electric field are reverse directions, they have the characteristic of expanding in the direction of a flat surface. Therefore, the ceramic layer 1*a* of the front side will be shrunk, and the ceramic layer 1*b* of the back side will be expanded. Therefore, the diaphragm 1 is bent so that the center portion becomes convex to a lower portion. If the voltage applied to the electrodes for external connection 21*a* and 21*b* is an alternating voltage, the diaphragm 1 can generate the bending vibration periodically and can generate large sound pressure as a result.

Figure 7:
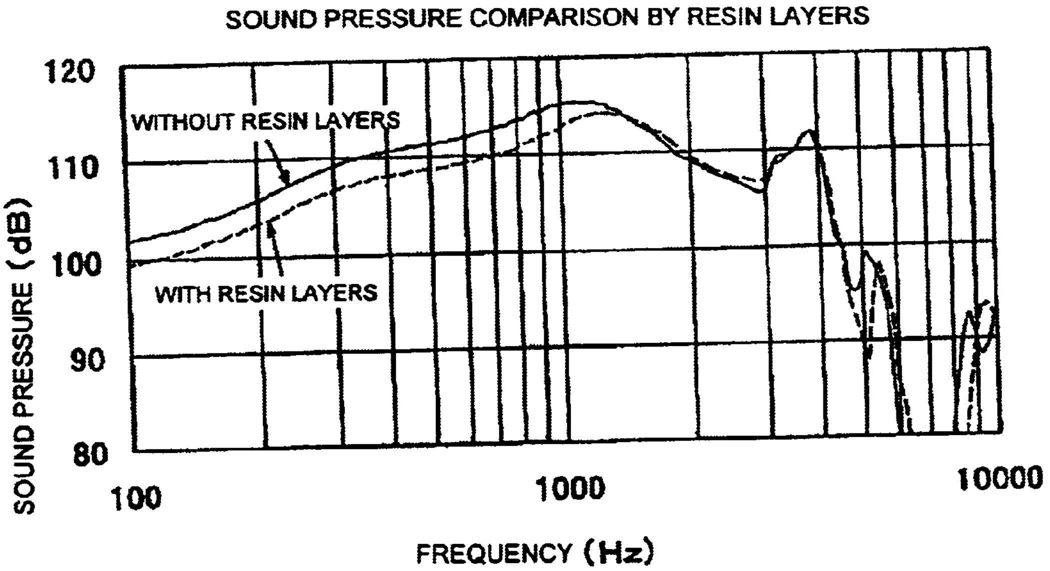
FIG. 7 is a sound-pressure comparison diagram of the diaphragm to which a resin layer is provided, and the diaphragm to which a resin layer is not provided.

Since the diaphragm 1 of the present preferred embodiment of the present invention is a bimorph type diaphragm in which the ceramic layers 1*a* and 1*b* are laminated, displacement is greatly increased compared with the unimorph type diaphragm using the metal plate, and therefore, much larger sound pressure is achieved. Moreover, because the displacement is not constrained by the metal plate, the sound of a low frequency is generated. In other words, the size is reduced while the sound having the same frequency is generated. Moreover, a shatter-resistant strength can be increased by forming the resin layers 6 and 7 as reinforcing members, without negatively affecting a sound pressure in the front and back surfaces, and therefore, the resonance frequency is improved greatly. FIG. 7 illustrates that the size of a diaphragm 1 is, for example, approximately 10 mm×10 mm×0.08 mm, and the sound pressure at the time of coating an epoxy group adhesive agent to have a thickness of about 20 Mm to the upper and lower surfaces of the diaphragm 1 as the resin layers 6 and 7 is compared with the case where the resin layer is not provided. As shown in FIG. 7, the sound-pressure reduction and the frequency change by providing the resin-layer 6 and 7 are not found.

Table 1 compares the shatter resistance strength of the case of preferred embodiments of the present invention where the resin layers 6 and 7 are provided to the diaphragm 1 as in FIG. 7, and comparison goods where the resin layer is not provided. In the table, "○" means that a crack is not generated and "×" means that the crack is generated. A drop test is conducted by putting the diaphragm 1 into the case shown in FIG. 1, attaching it to a 100 g of a jig, and dropping it in a horizontal direction.

TABLE 1

| Height of falling | comparative goods | Present invention |
|---|---|---|
| 30 cm | ○ | ○ |
| 75 cm | x | ○ |
| 150 cm | x | ○ |

In the above Example, the following effects were achieved by using a substantially rectangular diaphragm 1.

First, one point is that the acoustic conversion efficiency is greatly improved in preferred embodiments of the present invention. Since only the center portion defines a peak magnitude point, in a circular case diaphragm, a displacement volume is small, and sound conversion efficiency is relatively low. Moreover, the frequency becomes high since the surroundings of the diaphragm are constrained. The radius dimension will become large if it is to obtain the piezoelectric diaphragm having a low frequency. On the other hand, in a case of a substantially rectangle diaphragm 1, a peak magnitude point exists along the central line of the length direction, a displacement volume is large. A high acoustic conversion efficiency can be obtained. Moreover, although both ends in the length direction of the substantially rectangle diaphragm 1 are fixed, since a part therebetween can be freely displaced by the elastic sealing agents 14*a* and 14*b*, a low frequency compared with the circular diaphragm is obtained. Conversely, a size can be reduced if the same frequency is obtained.

Secondly, the point is that the productivity is improved. Although in the case of a substantially circular diaphragm, many punching dregs are generated since a diaphragm is punched from a motherboard. In a substantially rectangular diaphragm, since a laminated piezoelectric transducer can be cut out by dicing or other suitable process, punching dregs decrease. Moreover, because coating and the film of a resin layer can be formed on a very large size motherboard, a mass-production property is greatly improved and there is an advantage that the number of required manufacturing processes is reduced.

Figure 8:
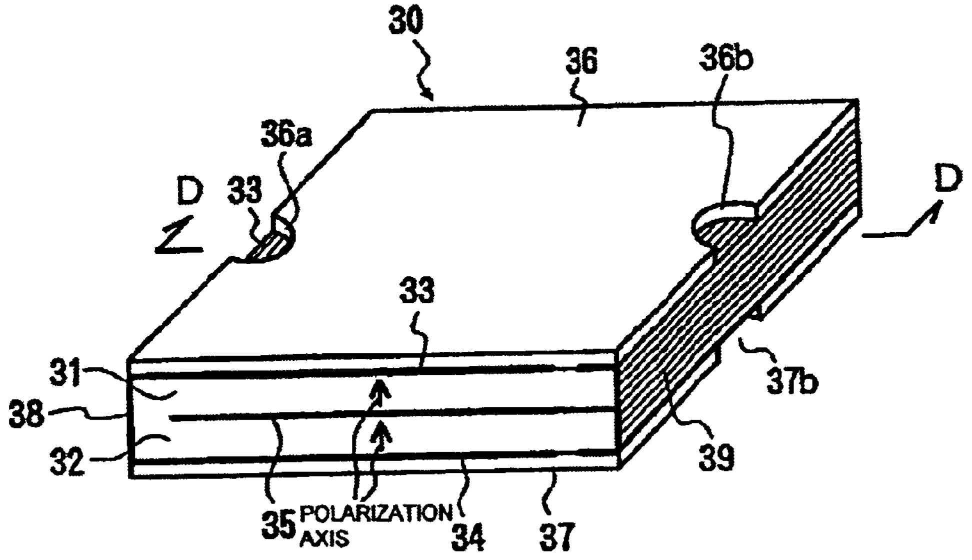
FIG. 8 is the perspective view of a second preferred embodiment of a diaphragm of the present invention.
Figure 9:
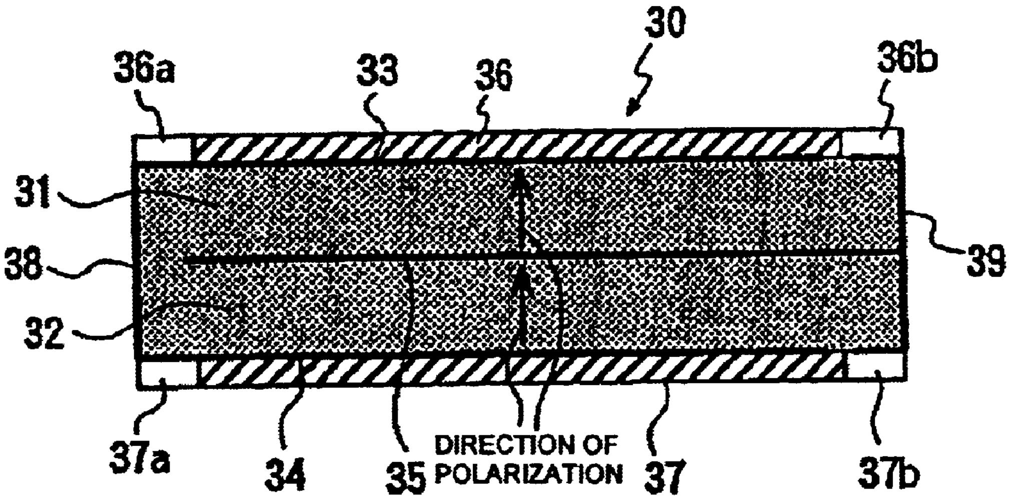
FIG. 9 is a sectional view taken along line D—D of FIG. 8.

FIG. 8 and FIG. 9 show a second preferred embodiment of a diaphragm. This diaphragm 30 is formed preferably by laminating the two substantially rectangular ceramic layers 31 and 32 as in the diaphragm 1 shown in FIG. 5 and FIG. 6, and the main surface electrodes 33 and 34 are formed on the upper and lower surfaces of the diaphragm 30. The main surface electrodes 33 and 34 are mutually connected via the first side electrode 38 disposed on one side surface of the diaphragm 30, and the internal electrode 35 is connected to the second side electrode 39 disposed on the opposing side surface.

In this preferred embodiment, the side electrodes 38 and 39 are arranged only on the side of the ceramic layers 31 and 32, and a part of the side electrode 39 turns even to the upper and lower surfaces of the ceramic layers 31 and 32. The notches 36*a* and 37*a*, where a portion of main surface electrodes 33 and 34 are exposed, are formed on the one end side of resin layers 36 and 37. The notches 36*b* and 37*b*, where a portion of the side electrode 39 turning to the upper and lower surfaces of the ceramic layers 31 and 32 are exposed, are formed on the other end side of resin layers 36 and 37.

The electrodes 33 and 34 and the side electrode 39 are exposed to the front and back surfaces of the diaphragm 1 through the notches 36*a* and 37*a*, and 36*b* and 37*b*. Therefore, when connecting the diaphragm 30 with the exterior through an electric conductive glue or other suitable material or method, connection operation can be performed easily and definitely. Moreover, with the diaphragm 1 shown in FIG. 5 and FIG. 6, because the electrode does not need to be formed on the surface of the resin-layers 6 and 7, there is an advantage that the electrode formation operation is greatly simplified.

Figure 10:
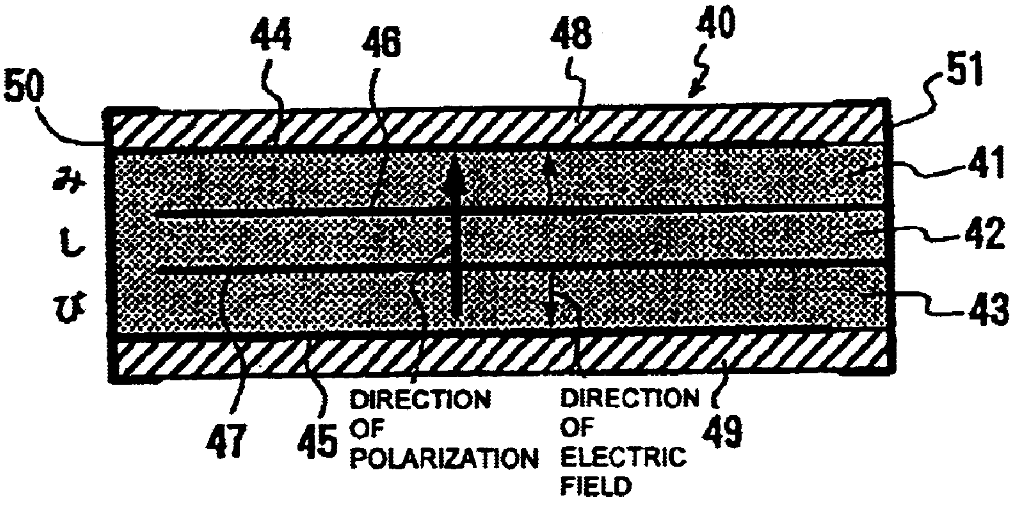
FIG. 10 is a perspective view of a third preferred embodiment of a diaphragm of the present invention.

FIG. 10 shows a third preferred embodiment of a diaphragm. The diaphragm 40 of this preferred embodiment is formed by laminating three piezoelectric ceramic layers 41 to 43. The main surface electrodes 44 and 45 are disposed on the surface of the ceramic layer 41 and the back-side of the ceramic layer 43. The internal electrodes 46 and 47 are disposed on respective ones of the ceramic layers 41 to 43. As a thick line arrow shows, the three ceramic layers 41 to 43 are polarized in the same direction in the thickness direction.

The resin layers 48 and 49 which cover the main-surface electrodes 44 and 45 are entirely formed on the front and back surfaces of a diaphragm 40. The main-surface electrodes 44 and 45 are extended as in the case of FIG. 6 from one short side to just before another short side of the diaphragm 40, and that one end thereof is connected to the side electrode 50 formed on one short-side side of the diaphragm 40. Therefore, the main-surface electrodes 44 and 45 of the front and back surfaces are connected mutually. Moreover, the internal electrodes 46 and 47 are extended from another short side to just before one short side as symmetrically as the main-surface electrodes 44 and 45, and one end thereof is connected to the side electrode 51 formed on another short-side side of the diaphragm 40. Therefore, the internal electrodes 46 and 47 are also connected mutually. In addition, the side electrodes 50 and 51 are formed so that they may turn to the front and back surfaces of the resin layers 48 and 49.

For example, if a negative voltage is applied to the side electrode 50 and a positive voltage is applied to the side electrode 51, the electric field of the direction shown by the thin-line arrow of FIG. 10 will occur. Since the internal electrodes 46 and 47 existing on both sides of the ceramic layer 42, which is an intermediate layer, have the same potentials at this time, an electric field is not generated. Since the direction of a polarization and the direction of an electric field are the same, the ceramic layer 41 of the front side is shrunk in the direction of a flat surface, and since the direction of a polarization and the direction of an electric field are reverse directions, the ceramic layer 43 of a back side is extended in the direction of a flat surface and thus, the intermediate layer 42 is not expanded or contracted. Therefore, a diaphragm 40 is bent so that it may become convex at a lower portion thereof. If an alternating voltage is applied between the side electrodes 50 and 51, a diaphragm 50 can cause the bending vibration periodically and can generate the sound of a large sound pressure as a result.

Although, in FIG. 10, the side electrodes 50 and 51 are arranged so that they turn to the front and back surfaces of the resin layers 48 and 49, as in the case of FIG. 8, the main surface electrodes 44, 45 and the side electrode 51 may be exposed by notching a portion of the resin layers 48 and 49.

The manufacturing method of the diaphragms 1, 30, and 40 of the preferred embodiments described above is preferably carried out as follows: two or three ceramic green sheets are laminated through an electrode film, for example, the resulting laminate is sintered at the same time. Then, the polarization is performed to the sintered laminate. Then, a resin layer is formed on upper and lower surfaces of the polarized laminate, and the laminate is cut into a predetermined element size, and then side electrodes are formed on sides of each element.

Moreover, instead of this method, it may be possible that two or three ceramic layers sintered and polarized beforehand are laminated and adhered to, resin layers are formed on upper and lower surfaces of the laminate, and the laminate is cut into a predetermined element size, and then side electrodes are formed on sides of each element.

Compared with the latter method in which ceramic layers sintered beforehand are laminated, the former method in which sintering is made after lamination can make the thickness of a diaphragm thinner markedly, and can enlarge a sound pressure. Therefore, it is possible to obtain a diaphragm having excellent sound transformation efficiency. Moreover, when a mother laminate is cut into a plurality of elements, the resin layer functions also as a reinforcement layer for preventing cracking of the element.

The present invention can be changed variously and is not limited to the above-described preferred embodiments.

The shape of a diaphragm (laminate) of the present invention is not restricted to substantially rectangle as in the preferred embodiments described above, and instead may have other forms such as substantially circular or other forms. Also, with a substantially circular case, the sound pressure is greatly increased compared with a unimorph type diaphragm.

As a housing structure for accommodating a diaphragm (laminate), it is not restricted to the structure of the FIGS. 1 to 4. Although the electrodes 21*a* and 21*b* for external connection were formed on the board 20 as shown in FIGS. 1 to 4, the electrode for external connection may be formed on a case 10 side, or a terminal may be fixed. Therefore, in this case, a board and a case are inverted upside down.

The first and second side electrodes 8 and 9 disposed on a diaphragm 1 are not restricted to being provided on opposing sides as shown in FIGS. 5 and 6. They can be also formed on a different position on the identical side of the diaphragm, so as to be adjacent to each other. In addition, the piezoelectric type electric acoustic converter of the present invention can be used also as sound-receiving bodies, such as a piezoelectric phone besides the application as sound-emitting bodies, such as a piezoelectric buzzer, a piezoelectric sounding device, and a piezoelectric speaker.

As clearly described above, according to a first preferred embodiment of the present invention, main surface electrodes are formed on front and back surfaces of the laminate including piezoelectric ceramic layers, the internal electrodes are formed between respective ceramic layers and all ceramic layers are polarized in the same direction in the thickness direction, if an alternating signal is applied between the main surface electrode and the internal electrode, the ceramic layers of the front side and the back side will expand in reverse directions, and the laminate will generate bending vibration as a whole. Because this amount of displacement is much larger compared with a unimorph type diaphragm, it greatly increases sound pressure.

Moreover, since all the ceramic layers are polarized in the same direction in the thickness direction, the complicated interconnection between a main surface electrode and an internal electrode required in the prior art is unnecessary with the present invention. It is sufficient just to apply an alternating signal between a main surface electrode and an internal electrode, the structure is very simple and greatly reduces a manufacturing cost. Furthermore, because the front and back surfaces of a laminate are covered by the resin layer, the laminate can be reinforced and a shatter resistance strength is greatly increased. Because the resin layer does not inhibit the bending vibration of the laminate, a sound pressure is not affected and a resonance frequency is not increased.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric type electric acoustic converter comprising:

a plurality of piezoelectric ceramic layers which are laminated to define a laminate;

main surface electrodes disposed on front and back main surfaces of said laminate, an internal electrode disposed between respective ceramic layers, and all of the ceramic layers are polarized in the same direction which is a thickness direction thereof;

said piezoelectric type electric acoustic converter generates bending vibration in response to application of an alternating signal between the main surface electrodes and the internal electrodes; and a resin layer arranged to directly contact and cover substantially all of the front and back surfaces of the laminate; wherein said resin layer is made of a material having a Young's modulus of about 1100 MPa.

2. A piezoelectric type electric acoustic converter according to claim 1, wherein the resin layer is a stiffened coating layer.

3. A piezoelectric type electric acoustic converter according to claim 1, wherein the resin layer is a resin film bonded to the laminate.

4. A piezoelectric type electric acoustic converter according to claim 1, wherein the laminate body has a substantially rectangular shape.

5. A piezoelectric type electric acoustic converter according to claim 1, wherein the main surface electrodes on the front and back surfaces are mutually conducted via a first side electrode disposed on a side of the laminate, and the internal electrode is conducted with a second side electrode disposed on a side of a position which is different from the first side electrode.

6. A piezoelectric type electric acoustic converter according to claim 5, wherein the first and second side electrodes are arranged to extend onto the front and back surfaces of the resin layers.

7. A piezoelectric type electric acoustic converter according to in claim 5, wherein the second side electrode is arranged to extend onto the front and back surfaces of the laminate, and the resin layers are provided with a first notch where a portion of the main surface electrode on the front and back surfaces are exposed, and a second notch where a portion of the second side electrodes turning to the front and back surfaces of the laminate are exposed.

* * * * *